US012418268B2

(12) United States Patent
Jang

(10) Patent No.: US 12,418,268 B2
(45) Date of Patent: Sep. 16, 2025

(54) MICROWAVE POWER AMPLIFIER

(71) Applicant: EXODUS COMMUNICATIONS INC., Seongnam-si (KR)

(72) Inventor: Min Gyu Jang, Seongnam-si (KR)

(73) Assignee: EXODUS COMMUNICATIONS INC., Seongnam-si (KR)

( * ) Notice: Subject to any disclaimer, the term of this patent is extended or adjusted under 35 U.S.C. 154(b) by 397 days.

(21) Appl. No.: 18/023,605

(22) PCT Filed: Mar. 10, 2021

(86) PCT No.: PCT/KR2021/002938
§ 371 (c)(1),
(2) Date: Feb. 27, 2023

(87) PCT Pub. No.: WO2022/080603
PCT Pub. Date: Apr. 21, 2022

(65) Prior Publication Data
US 2023/0308061 A1  Sep. 28, 2023

(30) Foreign Application Priority Data
Oct. 13, 2020 (KR) .................. 10-2020-0131596

(51) Int. Cl.
*H03F 1/02* (2006.01)
*H03F 3/195* (2006.01)
(Continued)

(52) U.S. Cl.
CPC ............. *H03F 3/245* (2013.01); *H03F 3/195* (2013.01); *H03F 3/602* (2013.01); *H03F 2200/451* (2013.01)

(58) Field of Classification Search
CPC ...................................... H03F 1/02; H03F 1/07
(Continued)

(56) References Cited

FOREIGN PATENT DOCUMENTS

KR 20160116942 10/2016
KR 20170034748 3/2017
(Continued)

OTHER PUBLICATIONS

International Search Report—PCT/KR2021/002938 dated Jul. 12, 2021.

*Primary Examiner* — Henry Choe
(74) *Attorney, Agent, or Firm* — CANTOR COLBURN LLP

(57) ABSTRACT

Provided is a 10W power amplifier for Ka band. The power amplifier includes, a drive amplifier; an intermediate stage amplifier composed of two transistors; a final stage amplifier composed of 4 transistors; a GCPW, waveguide, and a first spatial combiner unit which are sequentially connected between the drive amplifier and the intermediate stage amplifier to divide a signal output from the drive amplifier and provide the divided signal to the intermediate stage amplifier; a second spatial combiner unit, a waveguide divider, and a third spatial combiner unit which are sequentially connected between the intermediate stage amplifier and the final stage amplifier to divide signals output from the intermediate stage amplifier and provide the divided signals to the final stage amplifier; and a fourth spatial combiner unit and a waveguide combiner which are sequentially connected to the output terminal of the final stage amplifier to combine signals output from the final stage amplifier and finally output the combined signals.

5 Claims, 8 Drawing Sheets

(51) Int. Cl.
*H03F 3/24* (2006.01)
*H03F 3/60* (2006.01)

(58) Field of Classification Search
USPC .............................................. 330/124 R, 295
See application file for complete search history.

(56) References Cited

FOREIGN PATENT DOCUMENTS

| | | |
|---|---|---|
| KR | 20180016432 | 2/2018 |
| KR | 20180065462 | 6/2018 |
| KR | 20180084284 | 7/2018 |

MICROWAVE POWER AMPLIFIER

TECHNICAL FIELDS

The present invention relates to a microwave power amplifier, and more specifically, to a new type of microwave power amplifier for Ka band to be configured to produce the same output as a conventional power amplifier, use only ½ of the number of transistors compared to conventional power amplifier in order to reduce current consumption and improve efficiency, and have flatter gain characteristics in the entire frequency band of Ka band of 26.5 GHz to 40 GHz.

BACKGROUND ART

Since, in communication with satellites, the signal must be passed through the ionosphere, microwaves with a frequency higher than 1 GHz are used. 1.5 GHZ~1.6 GHz in the L band of 1 GHz~2 GHz is allocated for low orbit satellites, 2.5 GHZ~2.6 GHz in the S band of 2 GHZ~4 GHz is allocated for satellite control, 4 GHZ~6 GHz in the C band of 4 GHZ~8 GHz is allocated for geostationary satellites, 7 GHZ~8 GHz in the X band of 8 GHZ~12 GHz is allocated for military use, and 12 GHz~14 GHz in Ku band of 12 GHZ~18 GHz is allocated for geostationary satellites. However, as traffic has recently increased, supply for RF demand has become insufficient despite the use of dual polarization of frequency reuse. Therefore, commercial use of frequencies in the Ka band of 26.5 GHz to 40 GHz, which have been rarely used due to severe attenuation by weather, is increasing.

A satellite communication system generally consists of elements such as earth stations, satellites, satellite repeaters, and ground control stations. The earth station is a device that transmits data from the ground to a satellite and receives data from the satellite. A power amplifier for Ka band is used to amplify a signal in the earth station and transmit it to a satellite using an antenna, or is used to amplify a signal in the satellites and to transmit it to the earth station. Therefore, the transistor used in the power amplifier for Ka band of the satellite communication system requires a large output. However, since there is no transistor with a large output, it is designed to produce the desired output by using several transistors with a small output.

FIG. 1 is a block diagram representing the configuration of a 10 W power amplifier using a Wilkinson power divider/combiner according to the prior art. Referring to FIG. 1, in the power amplifier using a Wilkinson power divider/combiner according to the prior art, the input signal sequentially passes through the drive amplifier 100 and the first power divider 110. And then, the signal is input to the two transistors 120 and 125 of the intermediate stage amplifier and amplified. The amplified signal in the intermediate stage amplifier passes through the second power dividers 130 and 135 and the third power divider unit 140 and is divided into eight signals. The eight signals are attenuated by a loss of 2.1 dB. The attenuated signals are applied to 8 transistors of the final stage amplifier 150 and amplified, respectively. The output signals of the final stage amplifier 150 are combined and output by the first, second and third power combiners 160, 170, 175 and 180. The signal finally output from the third power combiner 180 is attenuated by 2.1 dB from the total output of the final stage amplifier 150 and then output.

As described above, the conventional 10 W power amplifier using the Wilkinson power divider/combiner has a problem of low efficiency and high power consumption because eight 3 W transistors must be used in the final stage amplifier 150.

FIG. 9 is a graph representing frequency characteristics of a 10 W power amplifier using a Wilkinson power divider/combiner according to the prior art. Referring to FIG. 9, the conventional 10 W power amplifier using the Wilkinson power divider/combiner has a difference of about 4 dB in gain characteristics depending on the frequency in the full Ka band of 26.5 GHz to 40 GHz. Therefore, the 10 W power amplifier using the Wilkinson power divider/combiner according to the conventional technology also has a problem that the gain according to the frequency has too large a variation in the full Ka band.

DETAILED DESCRIPTION OF THE INVENTION

Technical Problems

In order to solve the above described problems, an object of the present invention is to provide a power amplifier capable of reducing the number of transistors constituting the final stage amplifier to reduce manufacturing cost and signal loss, as well as amplifying flatly the gain of the entire Ka-band.

Technical Solution to Problems

A power amplifier according to a feature of the present invention for achieving the above object includes; a drive amplifier composed of one or two or more transistors to amplify an input signal; an intermediate stage amplifier composed of two transistors; a GCPW, a waveguide, and a first spatial combiner which are sequentially connected between the drive amplifier and the intermediate stage amplifier to divide the signal output from the drive amplifier and provide the divided signal to the transistors of the intermediate stage amplifier; a final stage amplifier composed of 4 transistors; a second spatial combiner, a waveguide divider, and a third spatial combiner which are sequentially connected between the intermediate stage amplifier and the final stage amplifier to divide the signals output from the intermediate stage amplifier and provide the divided signals to the transistors of the final stage amplifier, respectively; and a fourth spatial combiner and a waveguide combiner which are sequentially connected to the output terminal of the final stage amplifier to combine the signals output from the transistors of the final stage amplifier and finally output the combined signals.

In the power amplifier according to the feature of the present invention, it is preferable that the GCPW is disposed between the microstrip line of the output terminal of the drive amplifier and the waveguide, and one end of the GCPW is composed of a tapered probe and connected to the waveguide, so that the GCPW can achieve a transition between the microstrip line and the waveguide.

In the power amplifier according to the feature of the present invention, it is preferable that the waveguide divider and the waveguide combiner include a first port and second and third ports branching from the first port, and a portion where the first port and the second and third ports meet and bent is formed in a stepped structure composed of a plurality of layers, so that the power amplifier is configured to have a bandwidth of a Ka band of 26.5 GHz to 40 GHz.

In the power amplifier according to the feature of the present invention, it is preferable that the power amplifier is a 10 W Ka band power amplifier which amplifies signals of the Ka band of 26.5 GHz to 40 GHz and outputs finally 10 W signals.

In the power amplifier according to the feature of the present invention, it is preferable that the first spatial combiner and the second spatial combiner are formed by using a printed circuit board (PCB) with a fin-line structure, and the transistors of the intermediate stage amplifier are composed of MMICs (Monolithic Microwave Integrated Circuits), and the first spatial combiner is disposed between the waveguide and the intermediate stage amplifier so that the signal input to the first spatial combiner is divided into two signals and provided the divided signal to the input terminals of the MMICs, respectively, and the second spatial combiner is connected to the output terminals of the MMICs to combine the signals output from the MMICs and finally output the combined signals.

Effects of the Invention

In general, the Wilkinson power divider/combiner has a loss of about 0.7 dB while being divided by 3 dB. In order to make a power amplifier with a final output of 10 W (40 dBm) using the Wilkinson power divider/combiner like the conventional power amplifier shown in FIG. 1, the final stage amplifier must be configured using 8 transistors with 3 W output. However, the 10 W power amplifier for Ka band according to the present invention is designed by using a GCPW, spatial combiners, and waveguide divider/combiners with much smaller loss, so that it is possible to implement a 10 W power amplifier by using only 4 transistors with 3 W output in the final stage amplifier.

Accordingly, the present invention can provide a power amplifier with high efficiency and low power consumption as well as the same output as the conventional power amplifier. That is, while the conventional 10 W power amplifier shown in FIG. 1 has a power efficiency of 20%, the 10 W power amplifier for Ka band according to the present invention has a power efficiency of 40%, which is twice the power efficiency of the conventional power amplifier. Meanwhile, a 20 W power amplifier can also be manufactured by using the method according to the present invention.

In addition, in the power amplifier according to the present invention, the housing of the power amplifier is manufactured of almost the same size as the power amplifier according to the prior art and the number of transistors used without additional parts is reduced by half, thereby reducing the production cost of the power amplifier by more than 30%.

In addition, the 10 W power amplifier using the Wilkinson power divider/combiner according to the prior art has a problem in that the difference of the gain according to frequency is as large as about 4 dB in the entire Ka band. However, the 10 W power amplifier for Ka band according to the present invention has a difference of the gain according to frequency of about 2.2 dB in the full Ka-band, which is almost flat. As a result, the power amplifier according to the present invention can improve the characteristics of the entire system by reducing the burden on the parts used together.

On the other hand, the loss of the Wilkinson Power Divider/Combiners used in the power amplifier according to the prior art is 0.7 dB, respectively, resulting in a loss of 2.1 dB for the output of the final stage amplifier, which reduces the final output. On the other hand, the power amplifier according to the present invention greatly reduces the loss of the output signal to 0.35 dB by using a spatial combiner with a loss of 0.25 dB and a waveguide divider/combiner with a loss of 0.1 dB at the output stage. Therefore, the power amplifier according to the present invention can generate an output of 10 W or more in the Ka band by configuring the final stage amplifier with only four transistors.

In addition, the GCPW used at the input stage of the power amplifier according to the present invention has a relatively large loss of 0.7 dB, but is used for the transition between the microstrip line and the waveguide. In addition, the signal output from the drive amplifier has a loss of 1.05 dB until it reaches the transistor of the intermediate stage amplifier, but when the signals output from the transistors of the intermediate stage amplifier are combined by using a spatial combiner, the signal increases by 2.75 dB. As a result, the signal applied to the transistors of the final stage amplifier becomes a sufficiently large value as needed.

In addition, the power amplifier according to the present invention has a difference of about 2.2 dB in gain according to frequency in the full Ka band by widening the bandwidth by cutting the layer step by step at the point where each port of the waveguide divider/combiner meets.

On the other hand, the power amplifier using the Wilkinson power divider/combiner according to the prior art has a large difference of about 4 dB in gain according to frequency in the full Ka-band. Due to this, the conventional power amplifier according to the prior art has a problem in that the difference of the delay and the phase increase, and as a result, the output is reduced when a plurality of amplifiers are combined and used. However, the power amplifier according to the present invention has a difference of about 2.2 dB in gain according to frequency in the full Ka-band. Therefore, it is possible to solve the problems described above with respect to the conventional power amplifier.

BEST MODE FOR CARRYING OUT THE INVENTION

Hereinafter, the structure and operation of a power amplifier according to a preferred embodiment of the present invention will be described in detail with reference to the accompanying drawings. In particular, the power amplifier according to the present invention may be configured as a 10 W power amplifier for Ka band.

Figure 1:
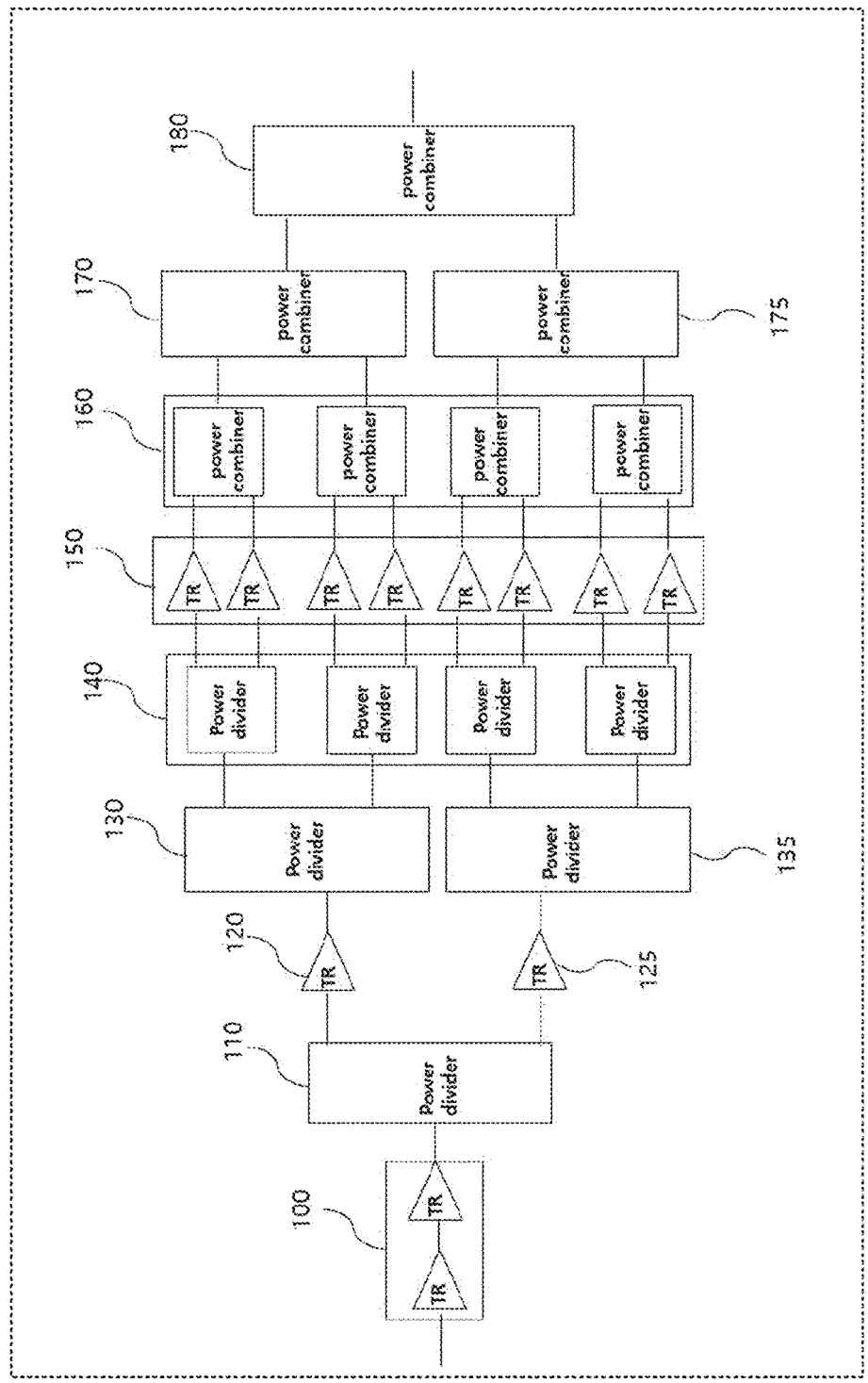
FIG. 1 is a block diagram representing the configuration of a 10 W power amplifier using a Wilkinson power divider/combiner according to the prior art.
Figure 2:
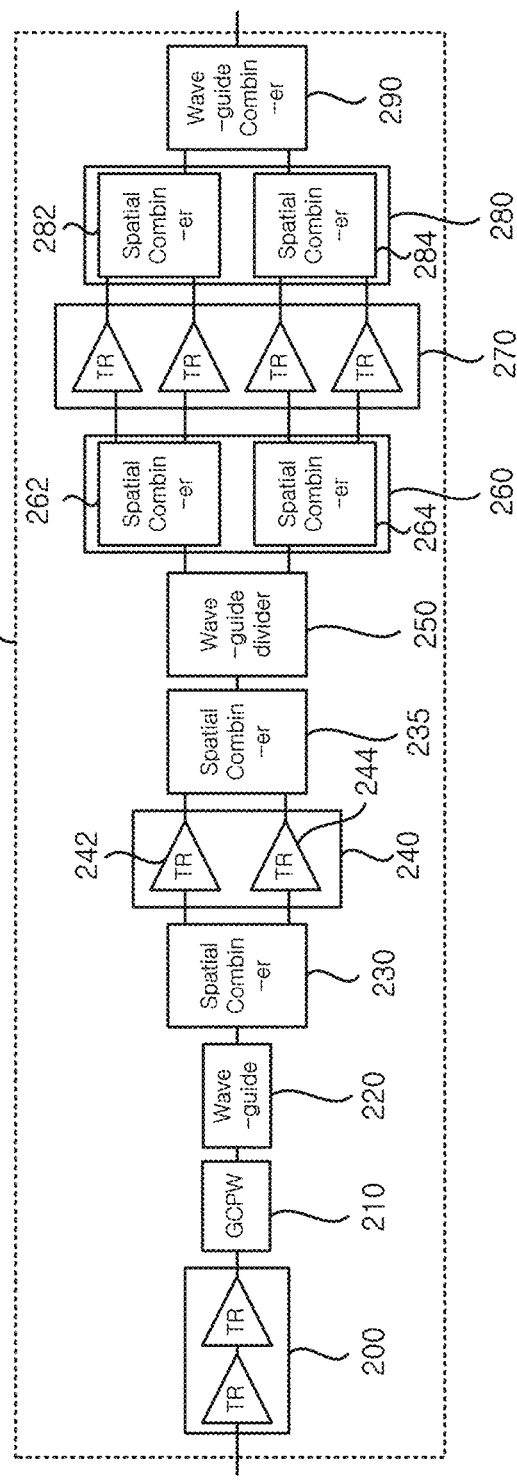
FIG. 2 is a block diagram representing the configuration of a 10 W power amplifier using a GCPW, a spatial combiner, and a waveguide divider/combiner in a power amplifier according to a preferred embodiment of the present invention.

FIG. 2 is a block diagram representing the configuration of a power amplifier according to a preferred embodiment of the present invention. Referring to FIG. 2, the power amplifier 20 for the Ka band according to the present invention includes a drive amplifier 200 composed of two transistors, an intermediate stage amplifier 240 composed of two transistors, and a final stage amplifier 270 composed of four transistors, a GCPW 210, a waveguide 220 and the first spatial combiner unit 230 sequentially connected between the drive amplifier and the intermediate stage amplifier, a second spatial combiner unit 235, the first waveguide divider 250 and the third spatial combiner unit 260 sequentially connected between the intermediate stage amplifier and the final stage amplifier, and the fourth spatial combiner unit 280 and the second waveguide combiner 290 connected to the output terminal of the final stage amplifier.

The entire signal flow of the power amplifier having the above configuration will be briefly described. First, a signal is input to the drive amplifier 200 composed of two transistors connected in serial each other. The microstrip line of the output terminal of the drive amplifier is connected to the waveguide 220 by using the GCPW 210, and the waveguide 220 is connected to the first spatial combiner unit 230, and the first spatial combiner unit 230 is connected to the intermediate stage amplifier 240, so that the signal output from the drive amplifier is applied to two transistors of the intermediate stage amplifier.

Next, the signals output from the two transistors of the intermediate stage amplifier 240 are combined by the second spatial combiner unit 235, pass through the waveguide divider 250 and the two spatial combiners 262 and 264 of the third spatial combiner unit 260 and are applied to four transistors of the final amplifier 270. The signals output from the final stage amplifier 270 are combined by the two spatial combiners 282 and 284 of the fourth spatial combiner unit 280 and combined by the second waveguide combiner 290 to be configured to finally output 10 W.

Hereinafter, each of the aforementioned components will be described in more detail.

Figure 3:
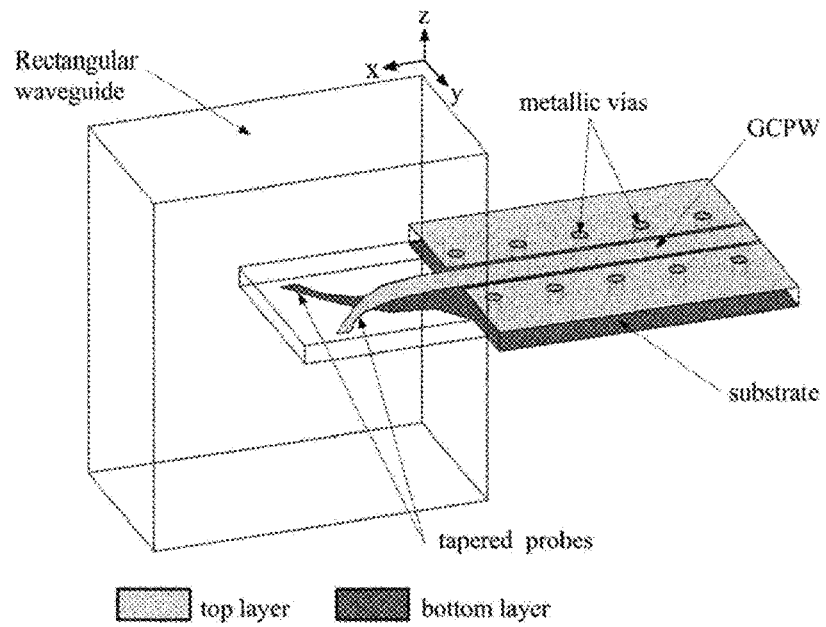
FIG. 3 is a diagram representing the structure of a GCPW in a power amplifier according to a preferred embodiment of the present invention.

FIG. 3 is a diagram representing the structure of a GCPW in a power amplifier according to a preferred embodiment of the present invention. Referring to FIG. 3, the GCPW 210 according to the present invention is designed to connect the microstrip line of the output terminal of the drive amplifier and the waveguide 220 to each other. The power amplifier according to the present invention has a wide bandwidth and small loss due to this design for the GCPW.

Figure 4:
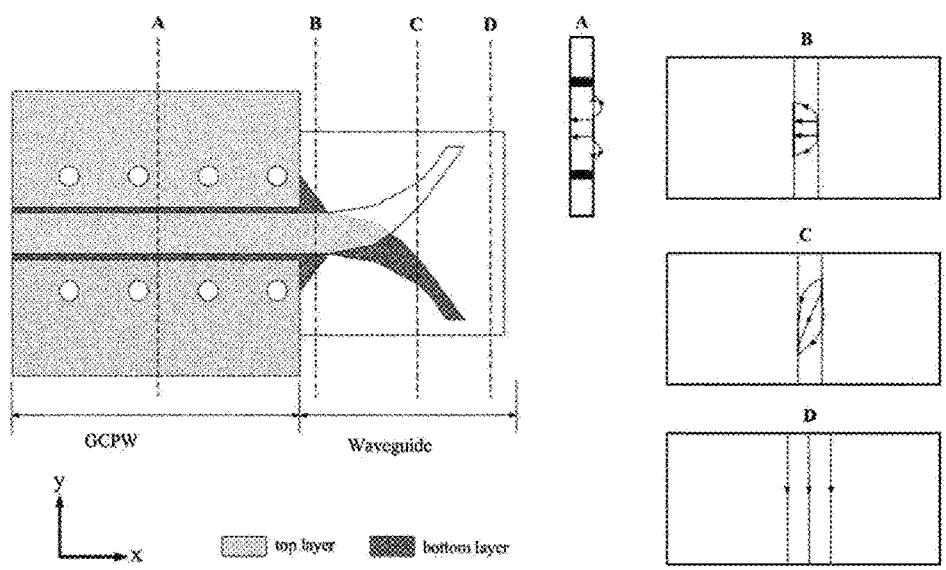
FIG. 4 is a diagram representing the field shape for each position of the GCPW of FIG. 3 in the power amplifier according to a preferred embodiment of the present invention.

FIG. 4 is a diagram representing the shape of the E-Field for each position of the GCPW shown in FIG. 3. Referring to FIG. 4, the distribution of E-Fields according to each location of the GCPW is as follows. In the area A corresponding to the GCPW part, the E-Field consists of an E-Field going from the upper conductor to the lower conductor and an E-Field going to the ground. In the area B where the tapered probe starts, there is only an E-field going from the upper conductor to the lower conductor, and there is no E-field going to the ground. In the area C where the tapered probe diverges, the E-Field is formed in an inclined shape. In the area D where the tapered probe is finished, the E-Field proceeds the waveguide in TE10 mode. By the process described above, the signal input to the GCPW performs a transition between the microstrip line and the waveguide.

Figure 5:
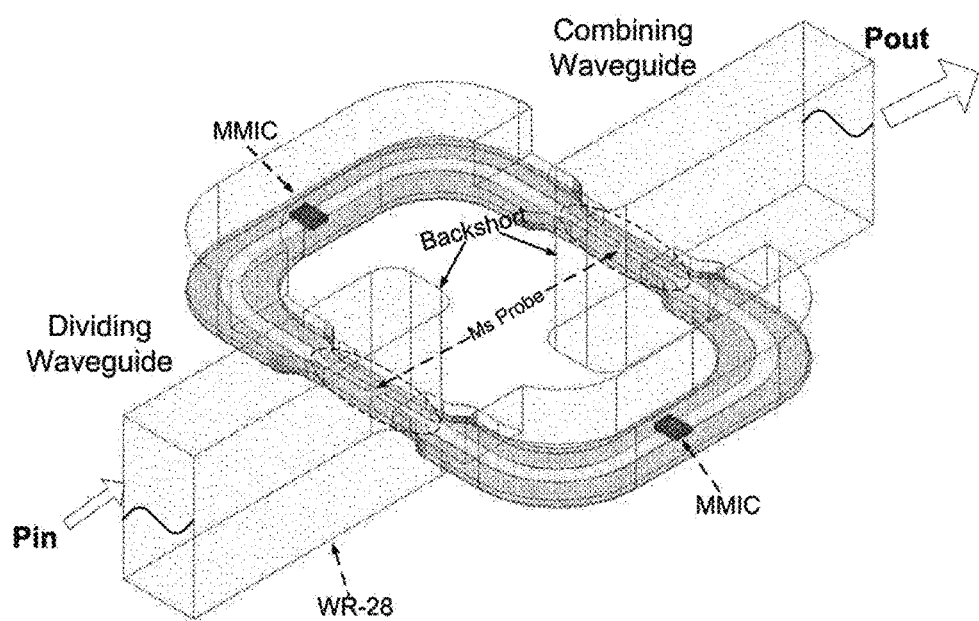
FIG. 5 is a diagram representing a structure of a spatial combiner and a structure in which two transistors are combined by using the spatial combiner in a power amplifier according to a preferred embodiment of the present invention.

FIG. 5 is a diagram representing a structure of a spatial combiner and a structure in which two transistors are combined using the spatial combiner in a power amplifier according to a preferred embodiment of the present invention. Referring to FIG. 5, the first spatial combiner unit 230 and the second spatial combiner unit 235 are manufactured by using a printed circuit board (PCB) with a fin-line structure, and the transistors 242 and 244 of the intermediate stage amplifier 240 may be composed of MMICs (Monolithic Microwave Integrated Circuits). The first spatial combiner unit 230 of the fin-line structure is disposed between the waveguide 220 and the intermediate stage amplifier 240, and the input signal of the first spatial combiner unit 230 is divided into two and provided to the input terminals of the MMICs respectively. The second spatial combiner unit 235 of the fin-line structure is preferably connected to the output terminals of the MMICs to combine the output signals of the MMICs and output them to the waveguide divider 250.

Figure 6A:
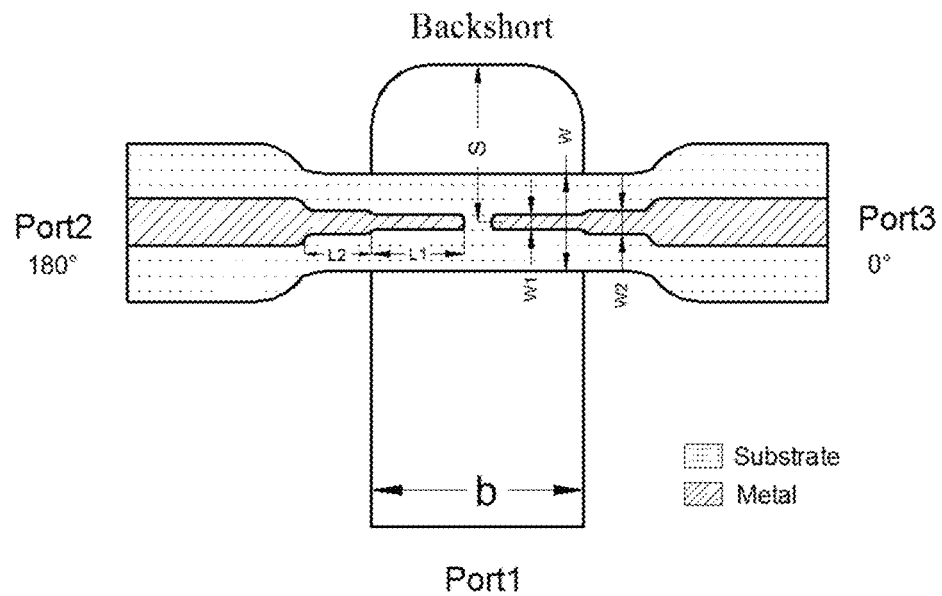
FIG. 6A is a diagram representing the structure of a combining part of a spatial combiner in a power amplifier according to a preferred embodiment of the present invention.
Figure 6B:
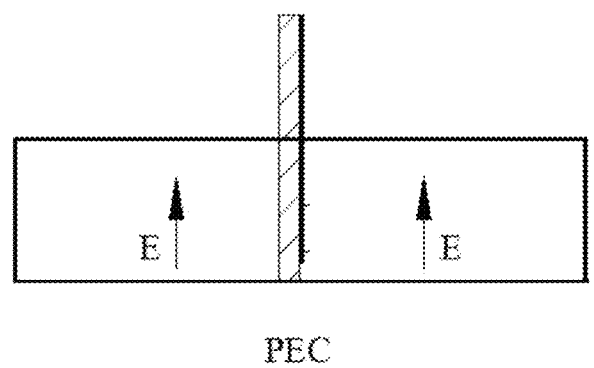
FIG. 6B is a diagram representing an E-Field distribution in the combining part of the spatial combiner of FIG. 6A.

FIG. 6A is a diagram representing the structure of a combining part of a spatial combiner in a power amplifier according to a preferred embodiment of the present invention. FIG. 6B is an E-Field distribution of the combining part of the spatial combiner in a power amplifier according to a preferred embodiment of the present invention.

Referring to FIG. 6A, the signal input to the waveguide of port 1 of the spatial combiner is opposite to the direction of the current induced by the E-field parallel to the probe, as shown in FIG. 6B. Therefore, the signal incident to port 1 is transmitted to port 2 and port 3 with the same magnitude and opposite phase. The output signals of the two transistors combined by the spatial combiner unit 235 of FIG. 5 passes through the output stage spatial combiner and outputs twice as much output as when using one transistor.

Figure 7:
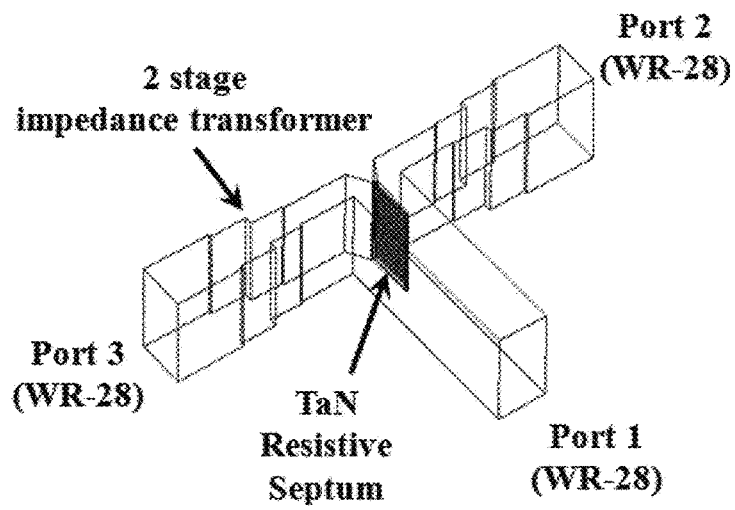
FIG. 7 is a diagram representing the structure of a waveguide divider/combiner in a power amplifier according to a preferred embodiment of the present invention.

The output signal of the above-described second spatial combiner unit 235 is divided into four through the waveguide divider 250 and the two spatial combiners 262 and 264 of the third spatial combiner unit 260, and then applied to the four transistors of the final stage amplifier 270. FIG. 7 is a diagram representing the structure of a waveguide divider/combiner 250 and 290 in a power amplifier according to a preferred embodiment of the present invention.

The signals input to the final stage amplifier 270 are amplified by transistors of the final stage amplifier 270 and then combined by the fourth spatial combiner unit 280 to be output finally through the waveguide combiner 290. At this time, the total loss of the fourth spatial combiner unit 280 and the waveguide combiner 290, which combine the signals output from the final stage amplifier 270, is 0.35 dB. Therefore, the final loss is 1.75 dB lower than the conventional power amplifier using Wilkinson power divider/combiner according to the prior art, and the final output is higher by 1.75 dB than the conventional power amplifier. For the conventional power amplifier using the Wilkinson power divider/combiner according to the prior art, the transistors of the final stage amplifier each output 33.1 dBm (2.14 W) to finally output 40 dBm (10 W).

However, the power amplifier according to the present invention can finally produce an output of 40 dBm (10 W) only when the transistors of the final stage amplifier each output 34.35 dBm (2.2 W). Therefore, the load on each transistor of the final stage amplifier is slightly increased. However, there is no problem since the final stage amplifier composed of 35 dBm (3 W) transistors can output both 2.14 W or 2.2 W.

In the power amplifier according to the present invention having the above configuration, the loss of the GCPW for the transition between the microstrip line and the waveguide is 0.7 dB, the loss of the spatial combiner for combining the two transistors is 0.25 dB, and the loss of waveguide divider/combiner for combining the output of the entire transistor is 0.1 dB. Therefore, the power amplifier according to the present invention can generate an output of 10 W in the Ka band by using only four transistors in the final stage amplifier.

However, in the power amplifier as shown in FIG. 2, the input signal of the power amplifier is attenuated by a loss of 1.05 dB in the GCPW 210, the waveguide 220, and the first spatial combiner unit 230, and the attenuated signal is combined by the second spatial combiner unit 235, applied to the intermediate stage amplifier 240 and amplified. The amplified signal in the intermediate stage amplifier 240 is attenuated by a loss of 0.6 dB in the waveguide divider 250 and the third spatial combiner unit 240, and the attenuated signal is applied to the four transistors of the final stage amplifier 270 and amplified. Therefore, since the power amplifier of FIG. 2 has a loss 0.45 dB smaller than that of the conventional power amplifier according to the prior art, there is no significant difference from the conventional power amplifier.

However, the signal of the final stage amplifier 270 is reduced by only a loss of 0.35 dB while passing through the fourth spatial combiner unit 280 and the waveguide combiner 290, and is finally output. Therefore, the output signal is increased by 1.75 dB compared to the conventional power amplifier. Since, in the power amplifier according to the present invention, the signal input to each transistor of the final stage amplifier 270 is 0.45 dB larger than the conventional power amplifier and the loss of the spatial combiner and the waveguide combiner is small, the power amplifier according to the present invention can generate an output of 10 W by the final stage amplifier 270 composed of four transistors having an output of 3 W.

As a result, the present invention can solve the existing problem of using 8 transistors with 3 W output in the final stage amplifier in order to make a 10 W (40 dBm) power amplifier. In this way, the power amplifier according to the present invention can reduce the current consumption by half while reducing the number of transistors of the final stage amplifier used by half.

In addition, by using a method of widening the bandwidth by cutting the layer step by step at the point where ports of the waveguide divider/combiner meet each other, the power amplifier according to the present invention can amplify the full Ka band of 26.5 GHz~40 GHz. As a result, it is possible to solve the problem that the conventional power amplifier using the Wilkinson power divider/combiner has a large gain difference in the full Ka band.

Figure 9:
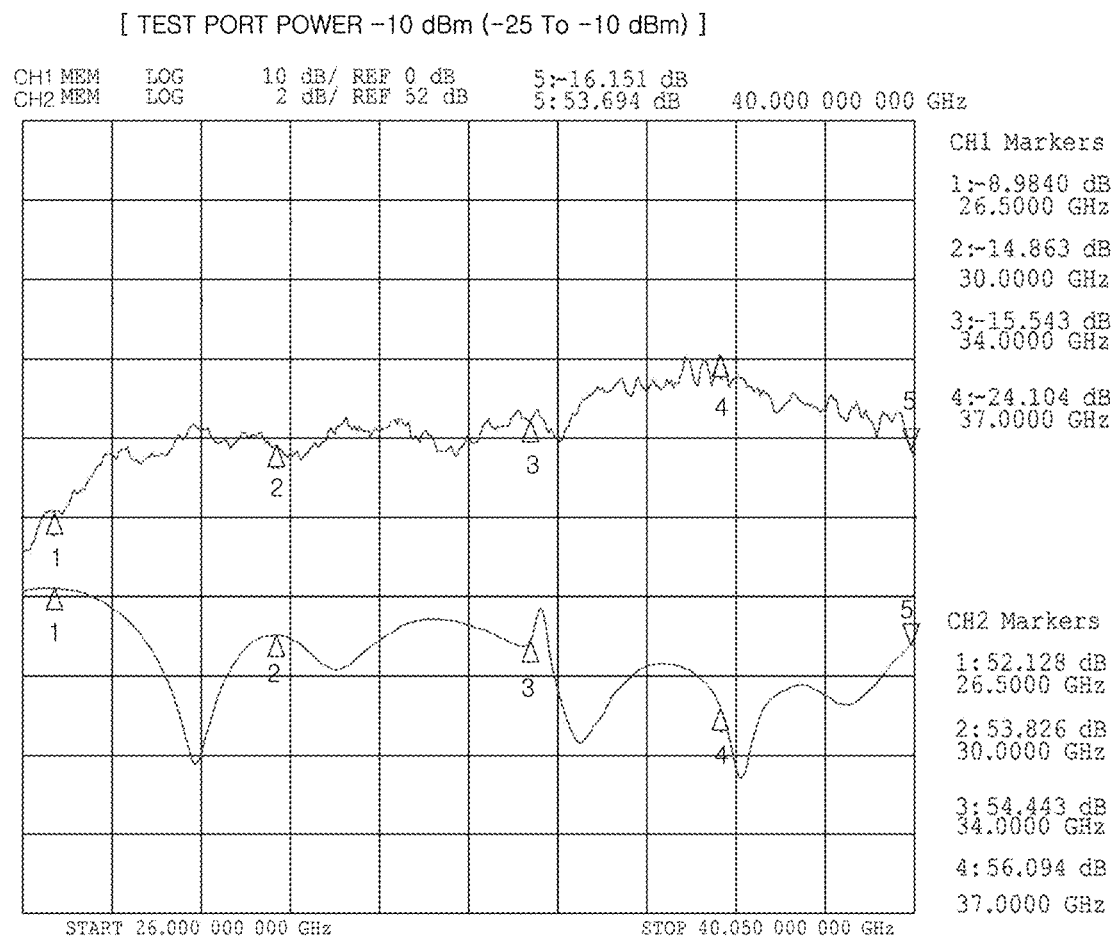
FIG. 9 is a graph representing frequency characteristics of a 10 W power amplifier using a Wilkinson power divider/combiner according to the prior art.

As shown in FIG. 9, the conventional power amplifier using the Wilkinson power divider/combiner shows a difference of about 4 dB in gain depending on the frequency in the entire Ka band of 26.5 GHZ to 40 GHz. However, in the present invention, the bandwidth can be widened by modifying the structure of the waveguide divider/combiner.

Figure 8:
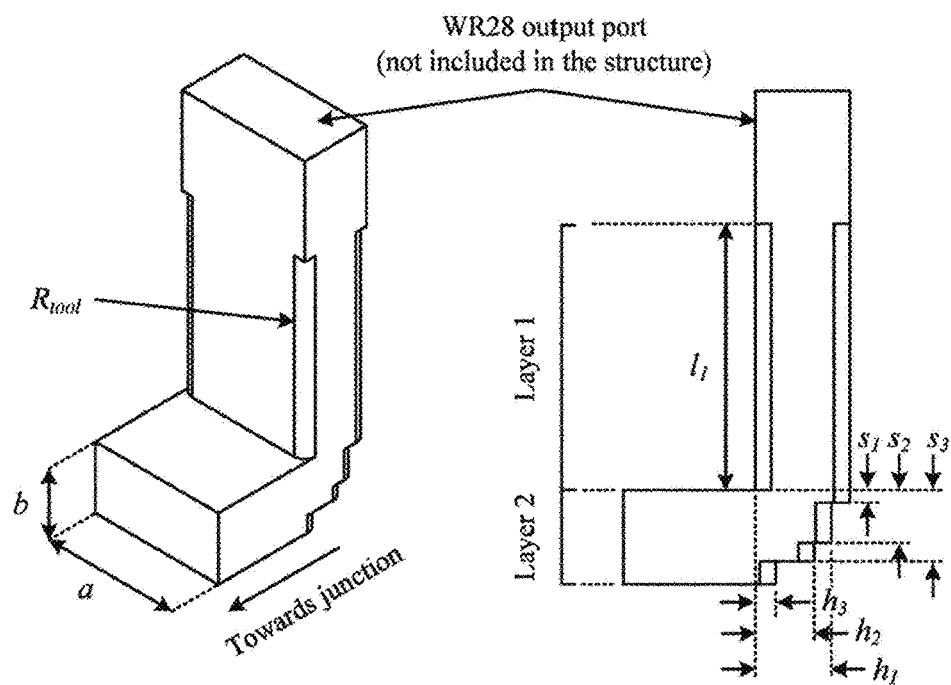
FIG. 8 is a diagram representing a modified structure of a corner of a waveguide to cover the full Ka band in a power amplifier according to a preferred embodiment of the present invention.

FIG. 8 is a diagram representing a modified structure of a corner of a waveguide to cover the entire Ka band in a power amplifier according to a preferred embodiment of the present invention. Referring to FIG. 8, the waveguide divider/combiner according to the present invention can expand the bandwidth by transforming the corner portion where Port 1 in FIG. 7 meets Port 2 and Port 3 into a stair structure composed of a plurality of layers.

Figure 10:
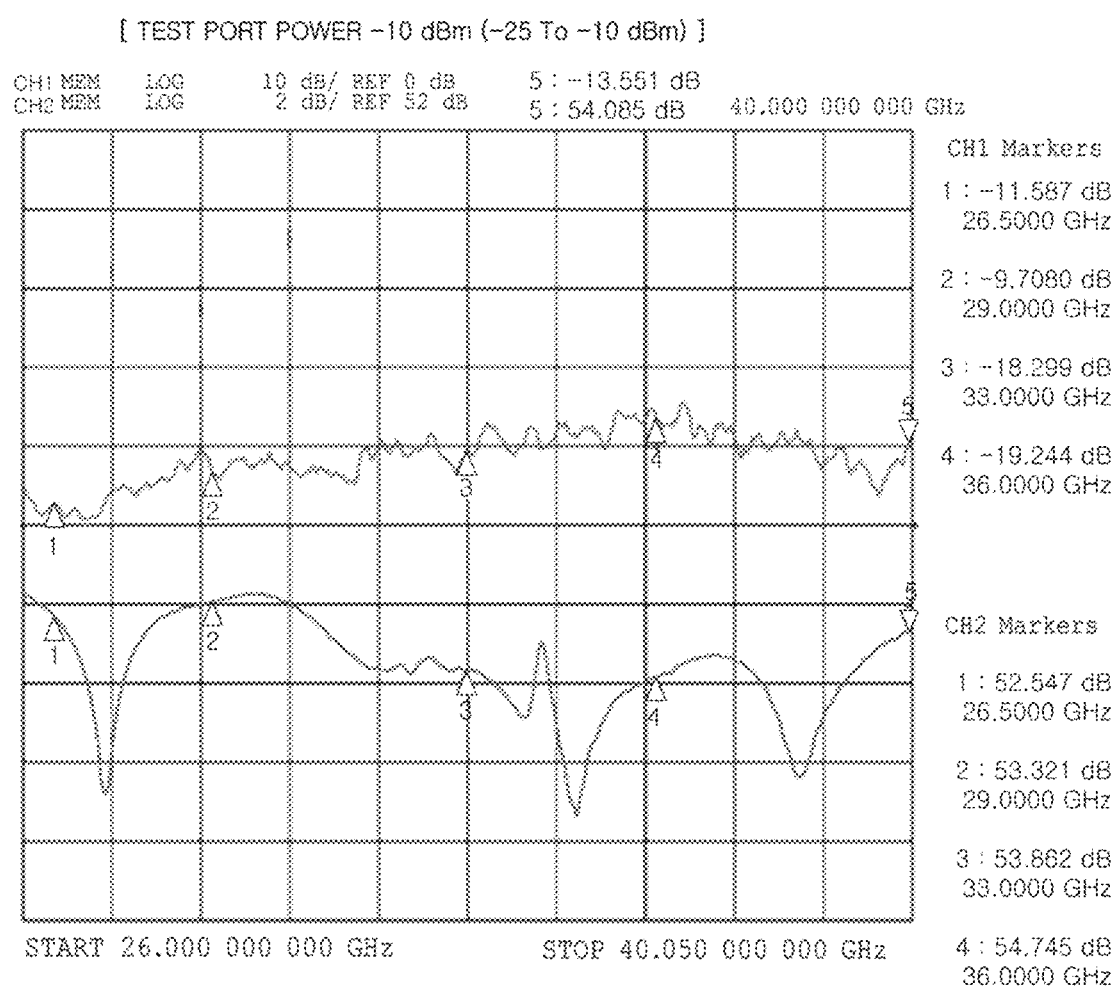
FIG. 10 is a graph representing frequency characteristics of a power amplifier according to a preferred embodiment of the present invention.

FIG. 10 is a graph representing frequency characteristics of a power amplifier according to a preferred embodiment of the present invention. As mentioned above, by modifying the structure of the corner region of the waveguide divider/combiner, as shown in FIG. 10, the gain has a variation of about 2.2 dB according to frequency in the entire Ka band. Accordingly, the waveguide divider/combiner of the power amplifier according to the present invention can greatly reduce the amount of output attenuation when using a group of amplifiers by reducing the delay and the differences of the phase.

Although the present invention has been described above with reference to preferred embodiments, this is only an example and does not limit the present invention, and those skilled in the art to which the present invention belongs do not deviate from the essential characteristics of the present invention. It will be appreciated that various modifications and applications not exemplified above are possible within the range. And differences related to these modifications and applications should be construed as being included in the scope of the present invention as defined in the appended claims.

INDUSTRIAL APPLICABILITY

The 10 W power amplifier for Ka band according to the present invention can be used for Ka band communication of 26.5 GHz to 40 GHz, where commercial use is becoming active due to a lack of RF supply compared to demand due to a rapid increase in traffic. In a satellite communication system composed of elements of an earth station, a satellite, a satellite repeater, and a ground control center, the 10 W power amplifier for Ka band according to the present invention can be used as a power amplifier for Ka band essential for transmitting and receiving data between the earth station and the satellite. In addition, the 10 W power amplifier for Ka band according to the present invention can be applied to amplifiers used in other bands to produce the same output while reducing the number of transistors. As a result, the 10 W power amplifier for Ka band according to the present invention can be used for designing a power amplifier to increase efficiency and reduce power consumption.

What is claimed is:

1. A power amplifier comprising of;
    a drive amplifier composed of one or two or more transistors to amplify an input signal;
    an intermediate stage amplifier composed of two transistors;
    a GCPW, a waveguide, and a first spatial combiner unit which are sequentially connected between the drive amplifier and the intermediate stage amplifier to divide a signal output from the drive amplifier and provide the divided signal to the transistors of the intermediate stage amplifier;

a final stage amplifier composed of 4 transistors;

a second spatial combiner unit, a waveguide divider, and a third spatial combiner unit which are sequentially connected between the intermediate stage amplifier and the final stage amplifier to divide signals output from the intermediate stage amplifier and provide the divided signals to the transistors of the final stage amplifier; and a fourth spatial combiner unit and a waveguide combiner which are sequentially connected to the output terminal of the final stage amplifier to combine signals output from the transistors of the final stage amplifier and finally output the combined signals.

2. The power amplifier according to claim 1, wherein the GCPW is disposed between the microstrip line of the output terminal of the drive amplifier and the waveguide, and one end of the GCPW is composed of a tapered probe and connected to the waveguide to form a transition between the microstrip line and the waveguide.

3. The power amplifier according to claim 1, wherein the waveguide divider and the waveguide combiner include a first port, and second and third ports branching from the first port respectively, and a corner portion where the first port meets the second and third ports and is bent is formed in a stair structure composed of a plurality of layers, so that the power amplifier is configured to have a bandwidth of the Ka band of 26.5 GHz to 40 GHz.

4. The power amplifier according to claim 1, wherein the power amplifier is a power amplifier for a Ka band that amplifies signals in a bandwidth of a Ka band of 26.5 GHz to 40 GHz.

5. The power amplifier according to claim 1, wherein the first spatial combiner unit and the second spatial combiner unit are formed by using a printed circuit board (PCB) of a fin-line structure, the transistors of the intermediate stage amplifier are comprising of MMICs (Monolithic Microwave Integrated Circuits), the first spatial combiner unit is connected to input terminals of the MMICs so that a signal input to the first spatial combiner unit is divided into two and the divided signal is output to the input terminals of the MMICs, respectively, and the second spatial combiner unit is connected to the output terminals of the MMICs to combine the signals output from the MMICs and output the combined signals.

* * * * *